MULTILAYER PRINTED-WIRING BOARDS

Original Filed Sept. 24, 1962 2 Sheets-Sheet 1

INVENTOR.
JOSEPH M. SHAHEEN
HENRY F. JONES
BY
A. M. Fernandez
ATTORNEY

MULTILAYER PRINTED-WIRING BOARDS

Original Filed Sept. 24, 1962 2 Sheets-Sheet 2

INVENTORS
JOSEPH M. SHAHEEN
HENRY F. JONES
BY
A. M. Fernandez
ATTORNEY

United States Patent Office 3,264,402

Patented August 2, 1966

3,264,402

MULTILAYER PRINTED-WIRING BOARDS

Joseph M. Shaheen and Henry Franklin Jones, Whittier, Calif., assignors to North American Aviation, Inc.

Original application Sept. 24, 1962, Ser. No. 225,754. Divided and this application Mar. 23, 1964, Ser. No. 353,999

2 Claims. (Cl. 174—68.5)

Figure 1A:
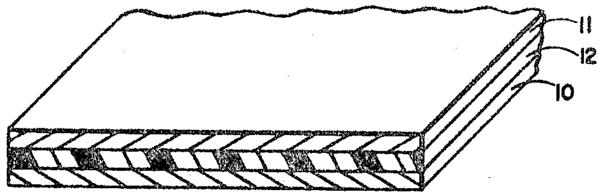

This is a divisional application of our co-pending application, Serial No. 225,754 filed September 24, 1962, entitled Method of Fabricating Multilayer Printed-Wiring Boards.

This invention pertains to multilayer printed-wiring boards and more particularly to laminated, multilayer printed-wiring boards.

The development of semiconductor devices has led to the design and fabrication of subminiature circuits through printed wiring techniques. However, there is a need for even more miniaturization due to the more recent development of solid-state functional circuits formed in crystals of semiconductor material. The effort to provide even more miniaturization has been referred to as microminiaturization, particularly when solid-state functional circuits are being interconnected through printed-wiring boards.

To achieve even greater circuit density through microminiaturization, it is often desirable to have more than one printed-wiring plane since one printed-wiring plane does not allow sufficient freedom in designing the interconnecting wiring for the most compact arrangement of the circuit components or solid-state functional circuits. Some freedom has been achieved through the development of double-sided, printed-wiring boards, both sides of which are interconnected as required through the base or support made of insulating material, such as glass cloth impregnated with epoxy resin. Such a base is frequently referred to hereinafter as a substrate.

When a microminiaturized board requires more than two interconnecting wiring planes to achieve the freedom necessary to design the interconnecting wiring for maximum density of components, as many printed-wiring boards as necessary may be stacked and interconnected, but stacking printed-wiring boards has not been always satisfactory. Some of the problems encountered in stacking wiring boards are first, that the air space required for insulation between boards is often greater in volume than the printed-wiring boards due not only to the dielectric constant of air but also to the physical structure of the electrical connectors provided between the boards and second, that the interconnections themselves often occupy more space than the circuit components or solid-state functional circuits being interconnected.

The use of pins, connecting rods or strips, and other means employed in the past, for spacing and interconnecting stacked printed-wiring boards are unsatisfactory for the further reason that their uses does not always yield the freedom sought in designing the interconnecting wiring between the components. For instance, if pins are used between the boards it is not always possible to arbitrarily place a pin at a given interconnecting point due to the mechanical problems of inserting the pin; instead, the pins must generally be placed individually with a maximum density determined by dimensions of the pin itself and dimensions of any tool employed to insert it. A further disadvantage of the prior art pin interconnectors is that the pin must rely on the boards for support so that it is generally necessary to allow the pin to pass through the boards. Connecting rods or strips and other means employed in the past impose similar limitations in designing interconnecting wiring. These and other problems have led to the development of the present invention.

Accordingly, an object of the present invention is to provide improved multilayer printed-wiring boards.

A further object is to provide an economical multilayer printed-wiring board without limitations as to the number of printed wiring layers and without limitations as to the number of location of interconnections between layers.

Another object is to provide a multilayer, printed-wiring board having interconnections between layers of wiring placed with such a freedom of design that each layer may be designed completely independent of any other layer, having regard only for the location of points in the adjacent layers to which interconnections are to be made.

These and other objects of the invention are achieved by covering both sides of a sheet of insulating material with sheets of conductive material, as for example, by laminating two sheets of copper together with a sheet of epoxy resin impregnated glass cloth. Before etching a pattern of wiring in either sheet of conductive material, a pattern of holes is etched through one sheet at points where interconnections are desired between layers of printed wiring using an acid resist for a mask and a solution which will not dissolve the insulating material, such as ferric chloride ($FeCl_3$) in the example. The hole pattern is then etched through the insulating material with a solution which will not dissolve the conductive material, such as a solution of hydrofloric and sulfuric acids ($HF$-$H_2SO_4$) in the present example, using the etched sheet of conductive material as a mask. Finally, before etching a pattern of wiring, redundant interconnections are provided by first plating through and then filling the holes with a conductive material, such as an alloy of gallium and gold which is plastic at normal room temperatures but which hardens at room temperature after a short period of time. The desired wiring pattern is then acid etched in the one sheet using a photo-resist mask.

If the printed-wiring board is to be a two-sided board, a second wiring pattern may be etched in the other sheet of conductive material while a wiring pattern is being etched in the one sheet; but, if the printed-wiring board is to have three or more layers, the foregoing process is repeated for each layer before a wiring pattern is etched in the other sheet on the bottom, either while or after the wiring pattern for the last layer is being etched. The process is the same for each layer except that each additional layer is added to a multilayer board by covering the last wiring pattern etched with a sheet of insulating material, covering the insulating material with a sheet of conductive material and laminating the stacked sheets to the board under a relatively low pressure and temperature.

The invention will become more apparent from the following description with reference to the drawings in which:

FIG. 1 pictorially illustrates a flow chart of a process for making the invention by depicting a sample multilayered printed-wiring board in various stages of fabrication; and FIG. 2 pictorially illustrates a flow chart of the repetition of the process for additional layers.

Referring to FIG. 1*a*, the step of laminating two sheets of copper 10 and 11 together with a sheet of insulating material 12 is illustrated as the initial step in fabricating a multilayer printed-wiring board.

It should be understood that the drawings are intended to be illustrative only; accordingly, the dimensions of the example depicted in the various stages of development are out of proportion. For instance, the thickness of the sheets of copper 10 and 11 may be one mil, while that of the insulating material may be six mils.

Both sides of the laminated board are then cleaned in a solution of hydrochloric acid ($HCl$) for about fifteen seconds, rinsed in deionized water and coated with photo-resist films 13 and 14 (FIG. 1*b*) of photosensitive emulsion, such as bichromated colloid or a resinous ester of maleic anhydride polymer with w-hydroxyalkoxy-acetophenones. The emulsion may be deposited by flow techniques and allowed to dry in an oven at 110° C. for about ten minutes. Upon being exposed to ultraviolet light, the photosensitive emulsion hardens to form an acid resist.

Figure 1B:
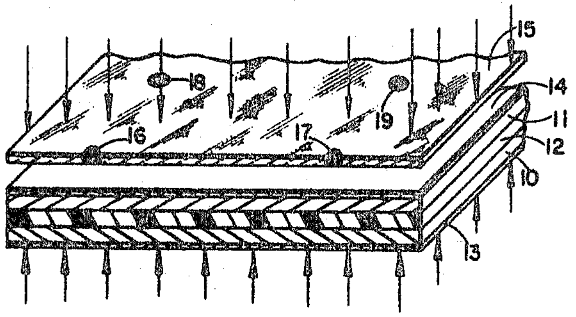

The second step depicted in FIG. 1*b* includes photoexposing the film of emulsion 14 with ultraviolet light for three to five minutes through a positive plate 15 of a pattern of holes 16 to 18 to be etched at points where interconnections between printed-wiring layers are to be provided. At the same time, the film of emulsion 13 on the other side is completely exposed to form a uniform film of acid resist for the etching process of the third step. The exposed emulsion is then developed ten to fifteen minutes in a suitable solvent of unexposed emulsion and rinsed in a solution of methyl ethyl ketone. The laminated board is dried again in an oven at 110° for about ten minutes before etching in the third step.

Figure 1C:
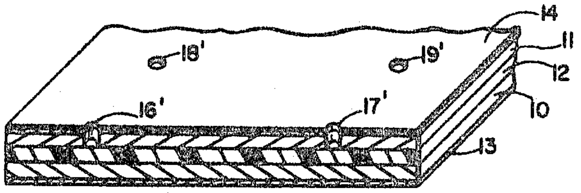

The third step depicted in the FIG. 1*c* consists of etching the pattern of holes in the sheet of copper 11, such as holes 16' and 17' shown in cross section, with a solution of ferric chloride ($FeCl_3$) which will not dissolve the exposed acid resist or the insulating material of resin-impregnated glass cloth employed to laminate the sheets of copper together. It should be understood that the materials described are illustrative and that other materials may be employed to practice the invention, keeping in mind only that the solution employed for etching the conductive material of the sheets 10 and 11 should not materially dissolve the insulating material 12 and that the solution employed for etching the insulating material in the next step should not materially dissolve the conductive material.

Although other insulating materials are available, until still other or more suitable materials are developed, it is preferred that the insulating material be selected from a class consisting of glass, epoxy resin, polyester, polyurethane, polyethylene terephthalate and combinations thereof, because each may be readily etched with a sulfuric acid solution, except glass, which may readily be etched with a hydrofluoric acid solution, and combinations thereof, which may be readily etched with a combination of sulfuric and hydrofluoric acids in solution. The combination formed by impregnating a cloth of glass fibre with an epoxy resin is more particularly preferred because it is sturdy yet flexible and may be directly employed to laminate sheets of conductive material by the mere application of heat and pressure. The solutions of sulfuric and hydrofluoric acids will not materially etch, or otherwise dissolve, the metallic conductive material in the short time required to etch the insulating material (about fifty seconds for a sheet of epoxy resin impregnated glass cloth about six mils thick), particularly if the sheet of conductive material is selected from a class consisting of copper, silver, gold and any alloy of each. Of that class, copper is preferred because it is readily etched with a ferric chloride acid solution which will not materially etch, or otherwise dissolve, any of the insulating materials of the preferred class.

Figure 1D:
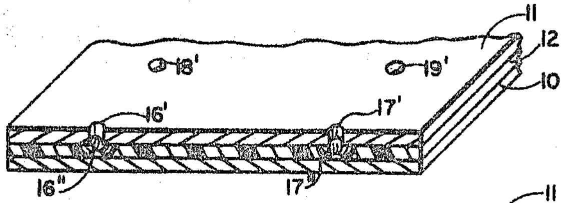

The next step depicted in FIG. 1*d* is to etch holes through the insulating material 12, such as holes 16'' and 17'' shown in cross section, with a solution of one part by volume of 70% hydrofluoric acid (HF) and two parts of 96% sulfuric acid ($H_2SO_4$). As noted hereinbefore, that solution is selected because it will not dissolve the copper material of the sheets 10 and 11 in the time necessary to etch through the substrate. Accordingly, the sheet of conductive material 11 having a pattern of holes etched through it functions as an acid resist in the fourth step of etching the holes 16'' and 17'' through the insulating material.

It should be noted that the holes 16'' and 17'' etched through the substrate of insulating material 12 are wider at the upper portions thereof. The undercutting beneath the sheet of conductive material 11 in each hole is due to the chemical etching process which tends to proceed at a uniform rate from the center of the corresponding masking holes 16' and 17' in the wheel of conductive material 11. The etching process produces more uniform holes in less time if the solution is agitated ultrasonically at a temperature of 160° F.

The undercut portions of the sheet 11 may be effectively removed by repeating the second and third steps after the fourth step to etch larger holes through the sheet of conductive material 11, the larger holes having a diameter approximately equal to the diameter of the upper portion of the holes 16'' to 19'' etched in the insulating material 12. However, although that may be desirable, it is not deemed to be necessary for the practice of the present invention because the next step is to make electrical interconnections through the etched holes 16'' to 19'' by some suitable method, such as by filling the holes with conductive material, which may be accomplished without removing the undercut portion around each of the holes 16' to 19'. The undercut portions may be etched away without covering the surfaces of the copper sheet 10 exposed by the holes 16''–17'' with an acid resist because the time necessary to etch the undercut portions away is less than the time necessary to etch through the copper sheet 10 due to the greater area exposed for etching through the undercut portions of the sheet 11. Any portion etched from the sheet 10 in the holes 16'' to 17'' may be restored by plating in the next step of the process, but that is not necessary.

Figure 1E:
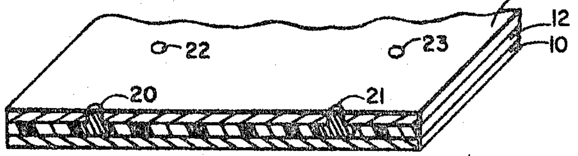

After the insulating material 12 has been etched through to the upper surface of the conductive material 10, the laminated board is immersed in a neutralizing solution and rinsed in deionized water before proceeding to the next step of providing conductive paths between the sheets 10 and 11 through the holes 16'' to 19'', as by filling the holes with conductive material from the upper surface of the lower sheet of conductive material 10 to the upper surface of the upper sheet of conductive material 11 in a manner depicted in FIG. 1*e* by a solid fill in each hole, such as fills 20 and 21 shown in cross section and fills 22 and 23. Before filling the holes 16'' to 19'', their walls may be electroless plated and then electro plated, preferably with copper. Since continuity may be reliably achieved by plating through the inside of the hole to provide interconnections, it is not necessary to completely fill the holes with conductive material. However, for greater reliability and strength, it is preferred that the holes be completely filled with conductive material.

A preferred method of completely filling the holes consists of forming an alloy of conductive material that is plastic or liquid at a given temperature and becomes hard at the same temperature. For the purposes of this invention, an alloy may be a substance composed of a metal and a non-metal, intimately united, such as copper, silver or gold and a resin, but a substance composed of two or more metals is preferred and more particularly preferred is a substance composed of a metal that is liquid at a relatively low temperature, such as gallium, indium or mercury, and a solid metal, such as copper, gold or silver. Specifically preferred is an alloy composed of a eutectic solution of gallium and indium (76% gallium by weight) mixed with gold (65% gold by weight) because it remains liquid or plastic at normal room temperatures for a period of about one hour before hardening and after hardening will remain stable in the solid phase at a temperature considerably higher than room temperature by about 400° to 500° C.

The alloy fill may be applied to the holes by a variety of techniques, as by squeezing if the alloy is plastic. For instance, the specifically preferred alloy of gallium, indium and gold may be squeezed into the holes at room temperature and then allowed to harden at a higher temperature of about 350° F. under a pressure of about 150 p.s.i. The higher temperature and pressure is recommended because if the alloy is too rich in gallium, it will not harden at room temperature; but at higher temperature, particularly under pressure, the alloy will exude enough droplets of gallium to change the proportion of gallium and thereby enable the remaining mixture to pass into a solid phase.

Another filling method is to form a mixture of powdered indium and gold (50% of each by weight), pour or shake the powdered mixture into the holes, and heat to a temperature above the melting point of indium (155° C.) to allow the alloying process to take place. Upon hardening, the indium-gold alloy will withstand a higher temperature (about 500° C.) as do many other alloys, particularly gallium alloys.

Still another method is to form spheres using a mixture of powdered metals by metallurgical techniques, each metal having a higher melting temperature than room temperature, such as a mixture of powdered gold, lead and tin. A sphere is placed over each hole and heated. Upon heating, the metal with the lowest melting temperature becomes a liquid and alloying takes place to form an alloy fill with a melting temperature considerably higher than the lowest melting temperatures of the separate metals, and for some alloys, such as indium and gold, higher than the highest melting temperatures of the separate metals.

Before proceeding to the next step, it is preferred that the board at that state of fabrication depicted in FIG. 1*e* be electroplated with copper to cover the exposed surfaces of the fills of conductive material, namely interconnections 20 to 23, with a protective film of copper, particularly if the conductive material employed is an alloy of a metal and a nonmetal. The protective film of copper will protect the fills 20 to 23 during subsequent processing for another printed-wiring layer as described with reference to FIG. 2 or for bonding electrical components to them as suggested hereinbefore.

Figure 1F:
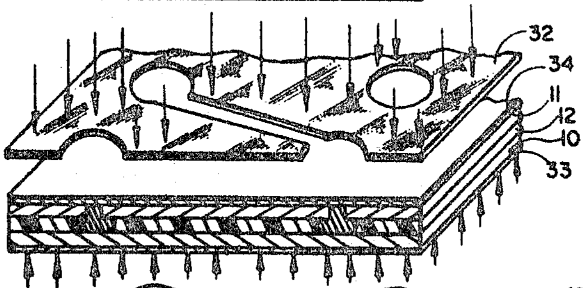

The next step depicted in FIG. 1*f* is to photo-expose the desired wiring pattern on the surface of the sheet of conductive material 11 with a negative 32 after it has been coated with a photo-sensitive emulsion (films 33 and 34) in the same manner as in the second step for etching the pattern of holes. It is standard practice to clean and rinse the surface of the printed circuit board after each etching process; accordingly, after the pattern of holes is etched through the sheet of conductive material 11 in the third step (FIG. 1*c*), the hardened emulsion is removed with a suitable solvent. Therefore, it is necessary to recoat the surfaces of the board in the sixth step with a photosensitive emulsion and to completely expose the bottom film to ultraviolet light when the top film 34 is exposed to the wiring pattern through the negative 32, thereby providing a protective coat for the sheet of conductive material 10 during the next step of etching the wiring pattern.

Figure 1G:
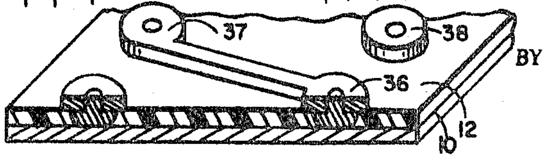

The following step of etching the wiring pattern in the sheet of conductive material 11 is depicted in FIG. 1*g* by the etched wiring pattern comprising two separate connecting pads 35 and 38 and two pads 36 and 37 connected by a strip of conductive material 39. The wiring pattern is separated from the sheet of conductive material 10 by the insulating material 12, but connected thereto by the four interconnections 20 to 23 through the respective pads 35 to 38.

If the printed-wiring board being fabricated is to have only two layers of wiring, the second wiring layer may be etched in the sheet of conductive material 10 as the last step in the process as depicted in the drawing. However, as noted hereinbefore, the second wiring layer may be etched while the wiring pattern 35 to 39 is being etched in the sheet of conductive material 11.

Figures 2A, 2B, 2C, 2D, 2E, 2F, 2G, 2H:
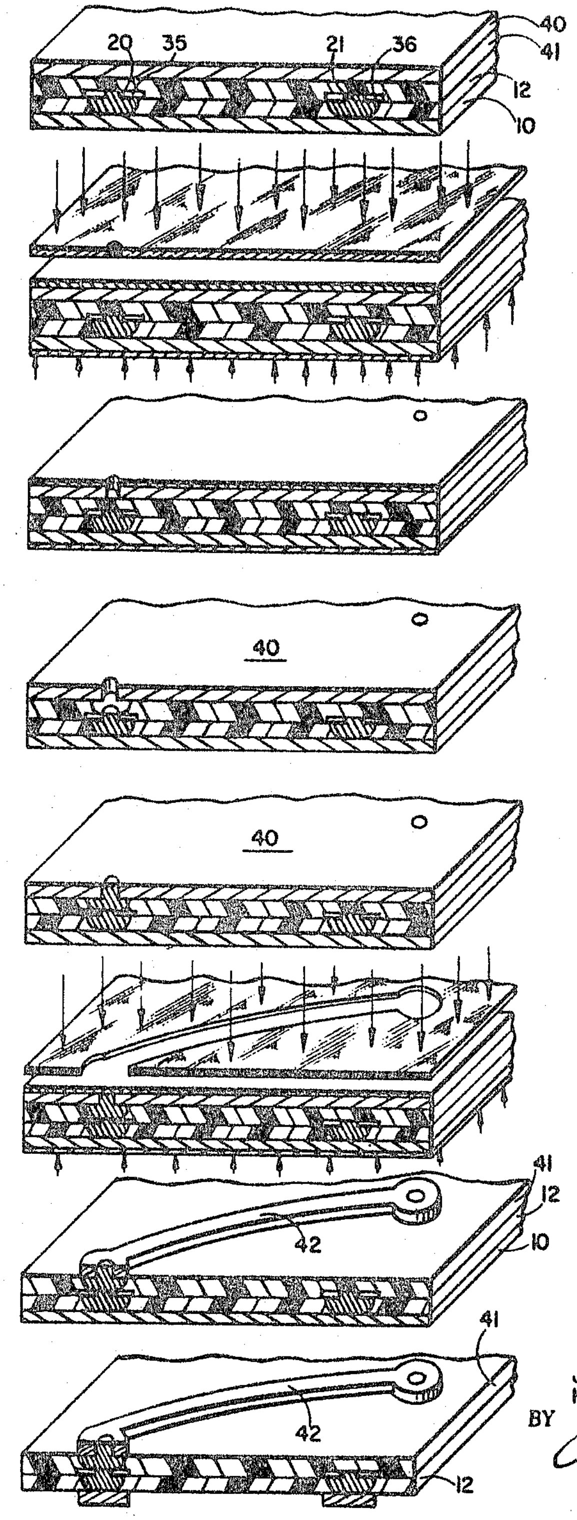

If a third printed-wiring layer is to be interconnected with the printed-wiring board, the first seven steps depicted in FIG. 1 are repeated to laminate a third sheet of conductive material 40 to the printed-wiring board with a sheet of insulating material 41 as depicted in FIG. 2*a*, after which a printed-wiring pattern may be etched on the bottom sheet of conductive material 10, either as a separate step as depicted in FIG. 2*h* or while a third printed-wiring layer 32 (FIG. 2*g*) is being etched in the third sheet of conductive material 40.

The steps of the process for providing the third printed-wiring layer are repeated in FIGS. 2*a* to 2*g* for clarity, beginning with the first step of laminating the sheet of conductive material 40 to the printed-wiring board with the sheet of insulating material 41. It should be noted that during the laminating process, the insulating material is compressed between the connecting pads, such as the pads 35 and 36, of the last printed-wiring layer and the sheet of conductive material 40. However, the thickness of about 4 to 8 mils selected for the insulating material is sufficient to provide the requisite insulation between a connecting pad of about 1 mil thickness and the sheet of conductive material 40 where interconnections are not desired. The proportions employed in the drawings are not to scale.

The remaining steps for the third printed-wiring layer are the same as the steps employed to develop the second printed-wiring layer etched in the sheet of conductive material 11. The specific steps depicted in FIGS. 2*a* to 2*g* for processing the third layer of conductive material 40 into the printed wiring pattern 42 may be repeated for as many additional layers as desired.

The resulting multilayer printed-wiring boards may be employed to microminiaturize interconnecting wiring almost without limit. The only limits are those imposed by the techniques currently available for the various steps. Techniques for copper etching have been developed to a high degree and the technique of acid etching through the substrate using an etched copper sheet as a mask makes it possible to simultaneously etch a large number of holes. The holes etched through the copper may be about .015 inch in diameter and the etched copper connecting pad surrounding the filled interconnecting holes may be .030 inch so that interconnections may be placed at a minimum distance almost as small as .030 inch center to center. The undercut referred to with reference to FIG. 1*d* will not impose a limit on this minimum distance if the thickness of the insulating material does not exceed one half the distance of the diameter of the hole etched through the copper sheet, or .0075 inch for .015 inch holes, because the diameter of the undercut has been found to be equal to $2T+D$ where T is the thickness of the insulating material and D is the diameter of the holes etched through the copper sheet. For example, if the thickness of insulating material is selected to be .006 inch, the diameter of the undercut is .027 inch so that the undercut is not a limitation on the minimum distance between interconnections since connecting pads of a diameter of .030 inch is desirable for connecting components or interconnections to other layers. The copper sheets may be about .001 inch thick, providing a total thickness for a two sided board of .008 inch. If greater rigidity is desired than is provided by a board .008 inch thick, a substrate .05 inch thick may be laminated on one side. However, that is not necessary in multilayer boards since rigidity of the board is increased with the addition of each layer.

While particular examples of the invention have been described, it should be understood that the invention is not limited thereto since many modifications may be made in the materials, proportions, temperatures, pressures and times of each step, as well as the processes employed to carry out each step. Accordingly, the terms of the appended claims are not to be limited to the particular examples and processes of each step, but to the true spirit and scope of the invention.

What is claimed is:

1. A multilayer printed-wiring board comprising, a first sheet of insulating material having a first printed conductor bonded to a top surface thereof and a second printed conductor bonded to a bottom surface thereof, an aperture in said first conductor at a location where an electrical interconnection between the conductors is desired, a solid conducting material having a protruding portion extending from said insulating sheet into a flush mount within said aperture, said protruding portion being bonded to said first conductor within said aperture, and a relatively larger portion continuous with said protruding portion and occupying a mushroom shaped opening in said insulating sheet with the top surface of said larger portion being bonded to the bottom surface of said first conductor in the area adjacent to the aperture, said relatively larger portion extending through said insulating sheet and electrically contacting the inside surface of the second printed conductor, said second conductor being continuous in the area where said larger portion makes electrical contact, the bottom surface of said larger portion being bonded to the inside surface of said second conductor.

2. The combination as recited in claim 1 further including a second sheet of insulating material disposed on said first sheet of insulating material and having a third printed conductor bonded to a top surface thereof, said third conductor having an aperture therein at a location where an electrical interconnection to said first conductor is desired, said second sheet further including a solid conducting material having a protruding portion extending from said insulating sheet into a flush mount within said aperture of said third conductor and a relatively larger portion thereof continuous with said protruding portion and occuping a mushroom shaped opening in said second sheet with the top surface of said larger portion being bonded to the bottom surface of said third conductor in the area adjacent to the aperture, said relatively larger portion extending through said insulated sheet and electrically contacting the first conductor of said first sheet with the bottom surface of said larger portion being bonded to the outside surface of said first conductor.

References Cited by the Examiner

UNITED STATES PATENTS

| | | | |
|---|---|---|---|
| 2,889,532 | 6/1959 | Slack. | |
| 2,907,925 | 10/1959 | Parsons. | |
| 3,102,213 | 8/1963 | Bedson et al. | |
| 3,143,787 | 8/1964 | Babbe | 174—68.5 X |
| 3,148,310 | 9/1964 | Feldman | 174—68.5 |
| 3,201,851 | 8/1965 | Stearns | 174—68.5 X |

FOREIGN PATENTS

| | | |
|---|---|---|
| 1,256,632 | 2/1961 | France. |

OTHER REFERENCES

Roche et al., "Circuit Board Connective Scheme," published in IBM Technical Disclosure Bulletin, vol. 6, No. 8, January 1964, page 87.

LEWIS H. MYERS, *Primary Examiner.*

DARRELL L. CLAY, ROBERT K. SCHAEFER, *Examiners.*